United States Patent
Heiliger et al.

(10) Patent No.: US 7,442,756 B2
(45) Date of Patent: Oct. 28, 2008

(54) POLYMER FOR SEALING POROUS MATERIALS DURING CHIP PRODUCTION

(75) Inventors: Ludger Heiliger, Neustadt (DE); Michael Schmidt, Dresden (DE); Georg Tempel, Dresden (DE)

(73) Assignee: Infineon Technologies AG, Munich (DE)

( * ) Notice: Subject to any disclaimer, the term of this patent is extended or adjusted under 35 U.S.C. 154(b) by 392 days.

(21) Appl. No.: 10/987,651

(22) Filed: Nov. 12, 2004

(65) Prior Publication Data

US 2005/0148202 A1     Jul. 7, 2005

Related U.S. Application Data

(63) Continuation of application No. PCT/EP03/06527, filed on Jun. 20, 2003.

(30) Foreign Application Priority Data

Jun. 20, 2002   (DE) ............................. 102 27 663

(51) Int. Cl.
  *C08G 77/28* (2006.01)
  *C08G 77/26* (2006.01)
(52) U.S. Cl. .......................... 528/27; 528/28
(58) Field of Classification Search ............ 528/27, 528/28
  See application file for complete search history.

(56) References Cited

U.S. PATENT DOCUMENTS

| | | | | |
|---|---|---|---|---|
| 4,552,905 A | * | 11/1985 | Keil et al. | 521/149 |
| 4,576,973 A | * | 3/1986 | Keil et al. | 521/149 |
| 5,008,153 A | * | 4/1991 | Hayes | 428/429 |
| 5,061,739 A | | 10/1991 | Shimizu | |
| 5,252,403 A | | 10/1993 | Blum et al. | |
| 5,603,985 A | * | 2/1997 | Kent et al. | 427/207.1 |
| 5,773,197 A | | 6/1998 | Carter et al. | |
| 5,882,799 A | * | 3/1999 | Roseboom et al. | 428/461 |
| 2004/0115910 A1 | | 6/2004 | Passemard et al. | |

FOREIGN PATENT DOCUMENTS

| | | |
|---|---|---|
| DE | 4107664 A1 | 9/1992 |
| FR | 2 819 635 | 7/2002 |
| FR | 2819635 | 7/2002 |
| JP | 01149879 | 6/1989 |
| JP | XP 002256549 | 3/1992 |
| JP | 09241532 | 9/1997 |
| JP | 2000154349 | 6/2000 |
| JP | EP 1122278 A2 | 8/2001 |
| JP | EP 1138732 A2 | 10/2001 |
| WO | WO01/54190 A1 | 7/2001 |

* cited by examiner

*Primary Examiner*—Margaret G Moore
(74) *Attorney, Agent, or Firm*—Jenkins, Wilson, Taylor & Hunt, P.A.

(57) ABSTRACT

A compound and method for sealing or protecting porous materials used in semiconductor fabrication, and in particular for protecting the inner walls of trenches or recesses or vias which are present in such materials. Specifically, compounds and the method of use of the compounds in which polymer compounds comprising functional groups A and B are used to seal surface-exposed pores in porous materials used in chip production.

24 Claims, 5 Drawing Sheets

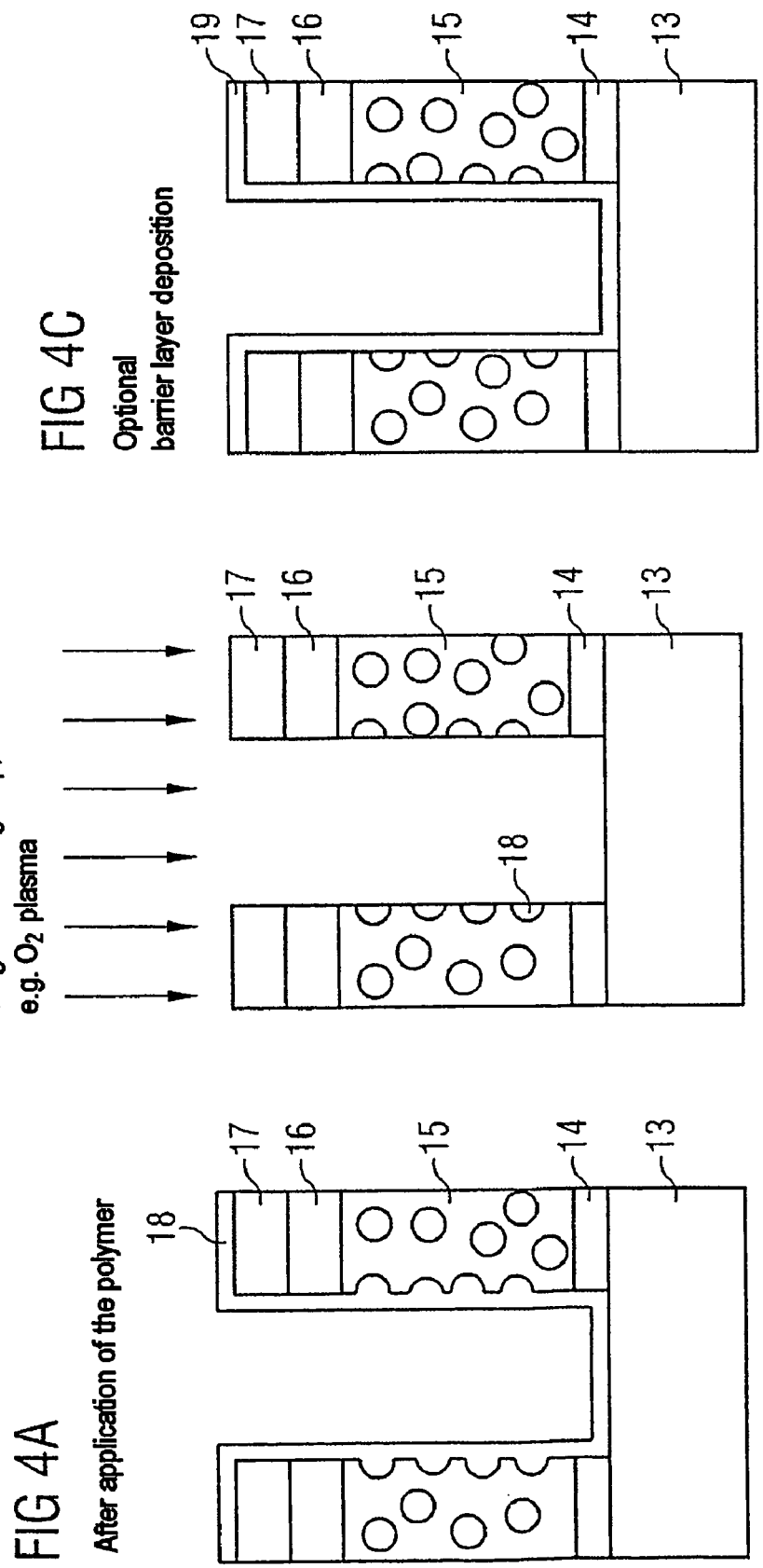

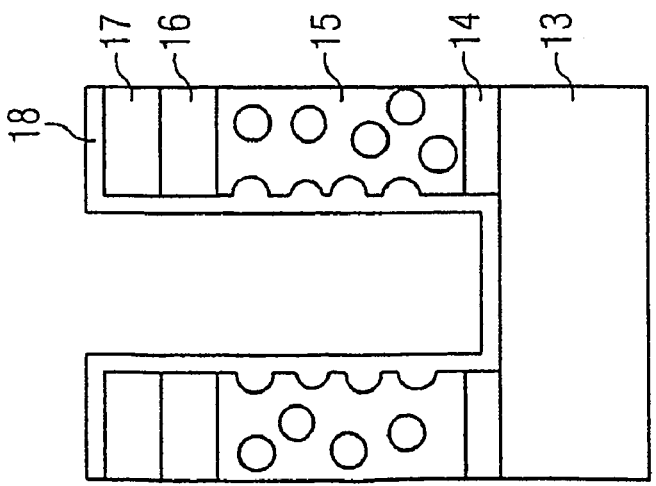
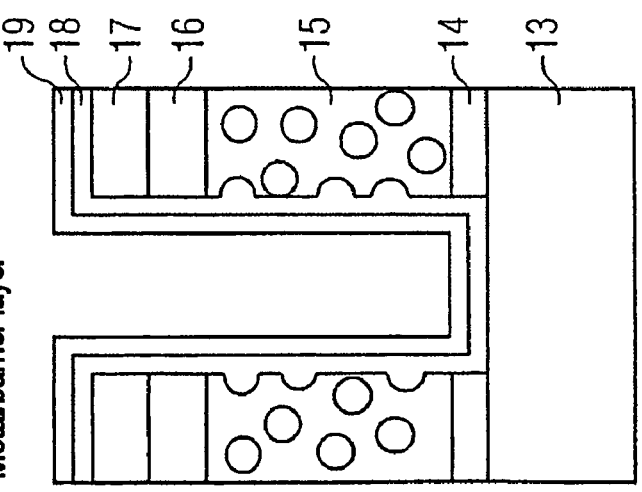
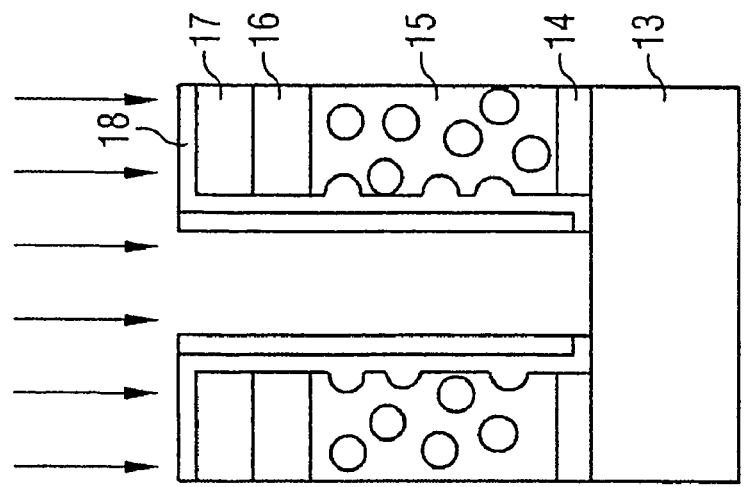

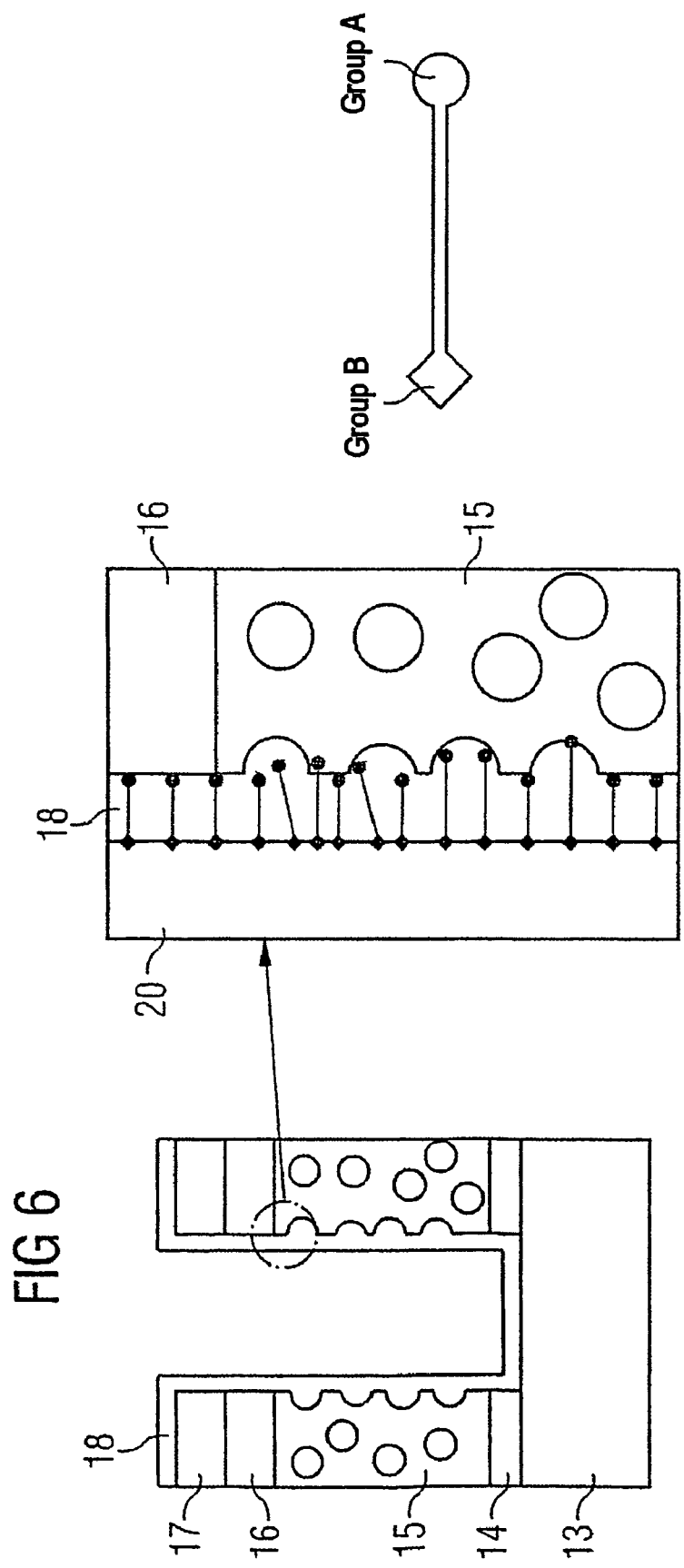

ations" (ILD). They
POLYMER FOR SEALING POROUS MATERIALS DURING CHIP PRODUCTION

RELATED APPLICATIONS

This application is a continuation of PCT patent application number PCT1/EP2003/006527, filed Jun. 20, 2003, which claims priority to German patent application number 10227663.3, filed Jun. 20, 2002, the disclosures of each of which are incorporated herein by reference in their entirety.

TECHNICAL FIELD

The present invention relates to a method in which polymer compounds comprising functional groups A and B are used to seal surface-exposed pores in porous materials used in chip production, to the compounds for this purpose and to the use of the polymer compounds.

BACKGROUND ART

The integration of multiple metallizations in integrated circuits or chips requires major changes in terms of the material and technological processes in order to reduce delays, capacitances and couplings between different metal tracks. The replacement of silicon dioxide with dielectrics with a low dielectric constant (known as low-k materials or interlayer dielectrics—ILD) is an imperative requirement for high densities and high-speed applications. By way of example, carbon-doped silicon dioxide, other silicon-containing materials and carbon-containing compounds are used as a replacement for silicon dioxide.

Examples of ILDs which are often used at the current time include:

| Product | Firm | Material type |
| --- | --- | --- |
| XLK | Dow Corning | Hydrogen silsesquioxane (HSQ) |
| 9-2222 (Boss) | Dow Corning | HSQ/MSQ (methyl silsesquioxane) |
| LKD5109 | JSR | MSQ |
| Zirkon | Shipley | MSQ |
| SiLK/p-SiLK (Version 1-9) | Dow Chemical | Organic compound; Si-containing |

Black Diamond (I/II) Applied Material also contains silicon.

Almost all low-k materials used contain silicon compounds. Exceptions include, for example, SiLK and p-SiLK (p=porous), which are purely organic compounds, and fluorinated hydrocarbons.

These materials are applied during chip production and serve as separating layers between metallization levels. These layers are also known as "interlayer dielectrics" (ILD). They are also referred to as "intermetal dielectric" (IMD) or "low-k layers".

During chip production, recesses are etched into these ILDs and are in turn filled with a metallic material so that they function as metallic interconnects. In addition, the metal tracks are also vertically connected to one another. This is achieved by the above-mentioned recesses being etched down to the metal track below at these contact locations. Additional auxiliary layers formed from silicon nitride and/or SiC are often also required, for example as an etching stop layer, as an etching mask or as a protective layer. The method described forms part of the prior art and is referred to as the dual Damascene process.

Intrinsic bubbles, that is to say cavities, which are formed during hardening by means of heating of the applied ILD layers, occur in particular in the abovementioned low-k ILD materials.

In the course of subsequent method steps which are customary during chip production and represent a thermal and/or mechanical load on the ILD material (e.g. etching, chemical mechanical polishing (CMP) or the like), these pores can form even larger cavities as a result of individual pores being connected to one another by passages. In particular at the inner wall regions of the recesses etched into these materials, surface-exposed pores, and therefore pores which are connected by passages, are exposed to contaminating chemical substances without any protection. In the context of chip production, the materials with a low dielectric constant then come into contact with various materials, for example water, atmospheric humidity or other chemicals, and these substances can penetrate into the cavities, thereby having an adverse effect or even destroying the actual function of the interlayer dielectrics (ILDs).

It is of considerable interest with a view to the integration of porous materials in particular in the back end of line (BEOL) part of chip production to prevent the penetration of contaminating substances into the porous material. The term back end of line is to be understood as meaning that part of chip production in which the electrical components, i.e. for example transistors, capacitors, etc., are wired. For this purpose, the electrical components are connected to one another in three dimensions by means of contacts (vias) and metal tracks (metal trenches). By contrast, the front end of line of chip production involves fabrication of the electrical components.

In the context of sealing surface-exposed pores in silicon-containing materials, it is already known to convert siloxane polymers into $SiO_2$ by means of ozone (M. Ouyang et al., Chem. Mater., 12 (2000) 1591).

EP 1 138 732 A2, EP 1 122 278 A2 and JP-1149879 A1 (Patent Abstracts of Japan) describe polymer compounds which contain Si-containing organic constituents and benzotriazole constituents. DE 4107664 A1 describes compositions which may contain Si-containing organic compounds and, as further constituents, benzotriazole.

WO 01/54190 A1 describes a method for filling contact openings and recesses (trenches, vias) with copper during chip production, in which the side walls of recesses etched into low-k materials are provided with an additional dielectric layer. Oxides, such as germanium oxide, silicon dioxide, nitrogen-containing silicon dioxide, nitrogen-doped silicon dioxide, silicon oxynitride and oxynitrides, are mentioned as examples of dielectric materials. Titanium oxide, tantalum oxide, barium strontium titanate and the like are also mentioned. Materials with a low dielectric constant which can be applied to the inner walls are also mentioned. A drawback of this method, in the case of deposition of materials with a low dielectric constant, is that once again materials with an intrinsic porosity are introduced. Moreover, the additional deposition narrows the recess, and consequently the recesses have to be made wider from the outset, which runs contrary to the aim of miniaturization for future technology generations.

A further drawback is that on account of the conformal deposition required, once again it is only possible to use CVD-type processes, which makes the chip production process more complicated and also runs the risk of the precursor compounds of this CVD material being able to penetrate into the pores.

Therefore, it would be desirable to provide a possible way of protecting the inner walls of recesses etched into materials with a low dielectric constant from the penetration of harmful chemical substances into surface-exposed pores during the chip production process, which could have an adverse effect on the dielectric properties of the ILD material.

Furthermore, it would be desirable to avoid diffusion or transfer of copper ions into the interlayer dielectric and to ensure the optimum possible contact or seating of the copper filling in the trenches.

SUMMARY OF THE INVENTION

According to the invention, this is achieved with the aid of the polymer compounds listed in claim 1 and by the methods claimed in claim 17, 27 and 34.

BRIEF DESCRIPTION OF THE DRAWINGS

FIG. 2 also shows an enlarged excerpt revealing that individual pores are connected to one another by passages.

Figure 3A:
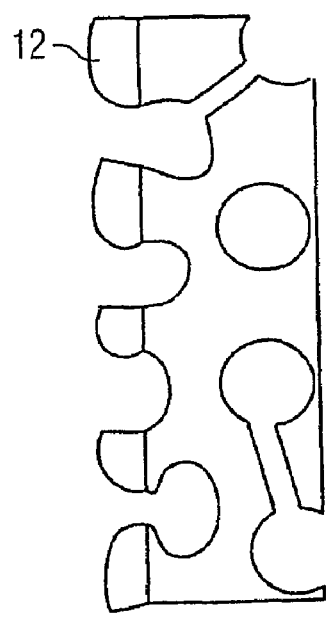
FIG. 3 shows a barrier layer lining of the inner walls of trenches in materials with a low dielectric constant, the lining consisting, for example, of tantalum/tantalum nitride.

It can be seen from FIG. 3a that coverage of the inner walls is incomplete, so that individual pore cavities are accessible to impurities.

Figure 3B:
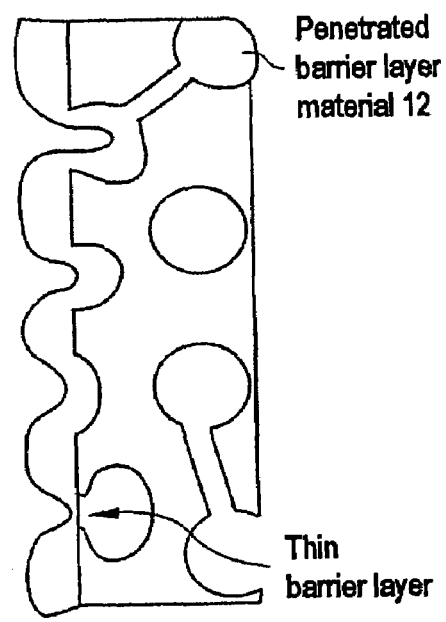

FIG. 3b shows a corresponding lining to that shown in FIG. 3a, but with more barrier layer material, in which case the coating material partially penetrates into the cavities of connected pores, thereby changing the dielectric constant of the material.

FIG. 4 shows a possible way of integrating the method according to the invention in semiconductor fabrication.

FIG. 4a illustrates a cross section through part of a wafer structure having a copper bottom layer, a protective layer above it and an interlayer dielectric above that, the interlayer dielectric having pores. Furthermore, an etching stop layer and a silicon dioxide layer are arranged above the interlayer dielectric. The etched trench has been coated with a polymer according to the invention.

In FIG. 4b, an etching step is carried out in order to remove the polymer layer from the recess, but the pores remain filled with the polymer according to the invention in the side wall region after etching, for example using an oxygen plasma.

FIG. 4c shows the possibility of an optional subsequent side wall lining with, for example, Ta/TaN.

FIG. 5 shows a further embodiment of the invention.

FIG. 5a corresponds to FIG. 4a. Then, in accordance with FIG. 5b, a side wall lining is carried out by means of, for example, tantalum nitride and tantalum, this lining being as thin as possible, after which a targeted etching step is carried out in FIG. 5c; during this etching step, the underside of the recess is etched clear, allowing contact to be made with the copper metallization below.

FIG. 6 diagrammatically depicts the arrangement of the polymer molecules according to the invention within the polymer layer that has been applied in accordance with the invention, following subsequent copper filling of the recesses. Group B is preferably arranged toward the copper, whereas group A is preferably arranged toward the silicon-containing material.

DETAILED DESCRIPTION OF THE INVENTION

The present invention relates to a method for sealing or protecting porous materials used in semiconductor fabrication, in particular for protecting the inner walls of trenches or recesses or vias which are present in such materials. The miniaturization of semiconductors is leading to increased fabrication of chip structures with multiple metallization layers. Copper is in increasing use as the metal, and the copper metallization layers are physically separated from one another, apart from at the contact regions between different metallization levels, by materials with as low a dielectric constant as possible. Currently, a metal layer is produced using the Damascene process. In this process, it is standard procedure for a trench-like recess with a rectangular cross section to be etched into the intermetal dielectric (interlayer dielectric, ILD) and then for this trench to be filled with metal. However, these metal tracks continue to be vertically insulated from one another by an ILD layer. For the various metal layers then to be connected to one another, additional recesses are etched through the latter ILD layer at the contact points, and these recesses are also filled with metal during the above-mentioned metal filling process. This method, including the contacts between the metal tracks, is also referred to as the dual Damascene process.

During the etching of the recesses and further subsequent method steps, however, dielectric materials with a low dielectric constant are damaged slightly. During subsequent processing steps, open pores at the side walls of recesses can come into contact with materials which penetrate into the pores and may thereby have an adverse effect on the properties of the dielectric.

The present invention now provides polymer compounds with which in particular the side walls of recesses of this type can be lined in order to seal the pores close to the surface but without penetrating into deeper cavities. These are polymer compounds with a polymer main chain and functional groups A and B, in which the functional group A can be bonded to silicon-containing materials and/or metal nitrides and has the following structure:

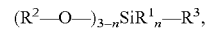

in which n=1 or 2, $R^1$ and $R^2$ are in each case an alkyl or aryl group, it being possible for $R^1$ and $R^2$ to be identical or different, and $R^3$ is an alkylene or arylene group;

and the functional group B can be bonded to copper metal, copper(I) oxide and/or copper(II) oxide and has one or more of the following structures:

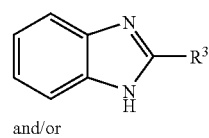 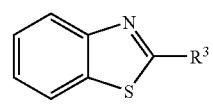

and/or

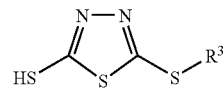

in which R¹ and R³ are as defined in group A,
and groups A and B are each linked to the polymer main chain via R³.

The present invention also relates to a method for sealing surface-exposed pores of porous materials with a low dielectric constant used in semiconductor fabrication, in which one or more of the following polymer compounds:
polymer compounds having a polymer main chain and functional groups A and B,
in which the functional group A can be bonded to silicon-containing materials and/or metal nitrides and has the following structure:

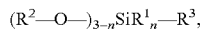

in which n=1 or 2,
R¹ and R² are in each case an alkyl or aryl group, it being possible for R¹ and R² to be identical or different,
and R³ is an alkylene or arylene group;
and the functional group B can be bonded to copper metal and/or tantalum, metal oxides, copper(I) oxide and/or copper(II) oxide and has one or more of the following structures:

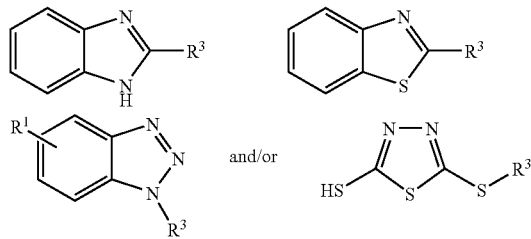

in which R¹ and R³ are as defined in group A,
and groups A and B are each linked to the polymer main chain via R³,
are applied to the porous material with a low dielectric constant.

In the context of the invention, the term "can be bonded" is to be understood as meaning that the respective group A and B forms a covalent or coordinate or ionic interaction with one or more of the abovementioned compounds.

The polymer compounds according to the invention in particular satisfy the following requirements:
the polymer compounds penetrate substantially only into the initial surface-exposed pores in the side walls and do not penetrate into deeper cavities.

They have a high thermal stability, which is necessary since temperatures of up to 400° C. are typically used in subsequent method steps, for example curing of low-k material, ALD (atomic layer deposition), CVD, etc.

Furthermore, it is possible to ensure a coefficient of thermal expansion which is in the region of the coefficient of thermal expansion of the low-k material and any materials used to line the inner walls, such as tantalum/tantalum nitride.

Furthermore, the polymer compound has good bonding to the low-k material, and the bonding for an optional lining material is not detrimentally effected or is even improved.

In particular, on account of the affinity of the electron-rich group B for copper, copper(I) oxide and copper(II) oxide or for copper ions, it is possible to prevent or at least reduce the extent of oxidation of the copper filling in the recess or to avoid further oxidation. This ensures that no copper ions escape and penetrate into the dielectric, which is often a serious source of defects. On account of this affinity or bondability with regard to Cu, CuO, Cu₂O and/or copper ions, according to the invention it is possible to ensure that diffusion of copper ions into the ILD can be prevented with barrier layer lining with permeability, since the diffusing copper ions can be trapped by the groups B.

Furthermore, the polymer compounds according to the invention have no adverse effect on the k value of the low-k material.

The polymer main chains may be standard commercially available polymers. It is preferable for the monomers of the polymer main chain to be ethylene, propylene, styrene, (meth)acrylates, acids, preferably adipic acid, (iso)terephthalic acid, alcohols, preferably butanediol, ethanediol or ethylene glycol, amines, preferably ethanediamine, hexanediamine, amino acids, such as aminocaprylic acid, ∈-caprolactam, ethers, preferably propylene oxide or ethylene oxide, epoxides, preferably epichlorohydrin, and/or it is preferable for the polymer main chains to be silicones, the monomer units of which are preferably dimethyldichlorosilane and/or diphenyldichlorosilane.

According to the invention, the person skilled in the art can in principle select from known polymer chains, although the polymer main chains, in accordance with the profile of requirements imposed on the polymers according to the invention, should in particular have a high thermal stability.

With regard to the radicals R¹ and/or R², straight-chain or branched $C_1$-$C_6$ alkyls are preferred as alkyls in group A. Among these, methyl and ethyl groups are particularly preferred.

Substituted or unsubstituted phenyl, biphenyl and/or naphthyl are preferred as aryl groups for R¹ and/or R² in group A. Furthermore, if it is substituted, it is preferable for the substituent to be a $C_1$-$C_{18}$ alkyl radical, preferably a $C_1$-$C_6$ alkyl radical.

Phenyl is particularly preferred as aryl group for R¹ and/or R² in group A.

R³ in group A and/or B, independently of one another, is preferably a $C_1$-$C_{18}$ alkylene radical, preferably a $C_1$-$C_6$ alkylene radical, and/or a $C_4$-$C_8$ cycloalkylene radical, preferably a $C_5$-$C_6$ cycloalkylene radical.

A substituted or unsubstituted phenylene, biphenylene and/or naphthylene are preferred as arylene group for R³ in group A and/or B, independently of one another; if it is substituted, it is preferable for the substituent to be a $C_1$-$C_{18}$ alkyl radical, more preferably a $C_1$-$C_6$ alkyl radical. It is particularly preferable for R³ in group A and/or B to be a phenylene radical.

It is preferable for R¹ in group B to be a straight-chain or branched $C_1$-$C_6$ alkyl radical, even more preferably methyl or ethyl.

To ensure that the polymer compounds do not penetrate into cavities in the low-k material to any greater depth than necessary, it is preferable for the polymer compounds to have a molecular weight of at least 10 000 Da, with molecular weights of up to 10 000 000 Da being possible. Molecular weights above 10 000 000 Da have only a limited solubility and their flow properties are insufficient, which makes them relatively unsuitable for practical reasons. Consequently, the polymer compounds according to the invention preferably have a molecular weight of from 10 000 Da to 10 000 000 Da, even more preferably 20 000-1 000 000 Da.

For the invention, there is no need for the polymers to be particularly homogeneous, provided that the polymer compounds are easy to apply, i.e. that they in particular are meltable and soluble in a suitable solvent.

The polymer compounds are preferably as far as possible substantially linear, i.e. they have a low degree of branching. However, this is not imperative, provided that the compounds are suitable for application.

The proportion of groups A and B in the respective polymer may vary within wide limits. The quantity can be controlled by means of the corresponding stoichiometry during production of the polymers, and the optimum quantity can be determined by the person skilled in the art. However, there should be at least one each of groups A and B per molecule. It is preferable for the ratio of the number of groups A to B to be approximately 30:70 to 70:30, also preferably 40:60 to 60:40, and also preferably approximately 50:50.

The polymer compounds according to the invention can be applied as such or preferably dissolved in a solvent. As far as possible, the demand should be imposed on the solvent that it does not dissolve the low-k material layer and on the other hand has no adverse effect on the dielectric properties of the low-k material should residues thereof penetrate into and remain in pores. Suitable solvents are hydrocarbons, such as hexane, cyclohexane, heptane, ethers, in particular THF, ketones, in particular methyl ethyl ketone. Toluene is also preferred in accordance with the invention. Therefore, according to the invention the present invention also encompasses a composition which contains or preferably consists of one or more polymer compounds of the present invention and one or more solvents. Preferred solvents are: alkanes, preferably $C_5$-$C_{10}$ isoalkanes, such as hexane and/or heptane, cycloalkanes, preferably cyclopentane and/or cyclohexane, ethers, preferably $C_2$-$C_8$ dialkyl ethers and/or tetrahydrofuran, and/or ketones, in particular $C_1$-$C_8$ dialkyl ketones, preferably methyl ethyl ketone, or toluene.

Group $R^3$ forms the link to the polymer main chain both for group A and for group B. Groups A and/or B can be linked to the polymer main chain using conventional methods known to the person skilled in the art, for example can be introduced by reactive group chemistry between polymer (e.g. isocyanate, anhydride, acyl chloride, epoxide) and component A and/or B (e.g. hydroxyamino or mercapto groups).

It is preferable for group A to have an increased presence at one end of the polymer molecule and group B to have an increased presence at the other end of the polymer molecule.

The polymer compounds according to the invention are suitable in particular for protecting porous interlayer dielectric materials with surface-exposed cavities during chip production.

Particularly suitable interlayer dielectric materials (low-k materials) include silicon-containing materials, such as carbon-doped silicon dioxide, silsesquioxanes, such as hydrogen silsesquioxane (HSQ) or methyl silsesquioxane (MSQ), and/or the low-k materials which are listed as examples below and are currently in widespread use: XLK (hydrogen-silsesquioxane, Dow Corning), 9-2222 (Boss) (HSQ/MSQ, Dow Corning), LKD 5109 (MSQ, JSR), Zirkon (MSQ, Shipley), SiLK/p-SiLK (Version 1-9) (organic compound with low silicon content, Dow Chemical), Black Diamond(I/II) (Applied Material).

Group A preferentially bonds to silicon-containing materials, such as silicates, silsesquioxanes, silicon carbide or metal nitrides, in which context silicon carbide and metal nitrides, in particular silicon nitride, are often used in chip production as protective layers on ILD and are therefore likewise part of the recess to be filled. Bonding is affected via group A either covalently or otherwise adhesively, for example by coordinate interactions and/or ionic interactions.

The present invention also relates to a method for sealing surface-exposed pores in porous materials with a low dielectric constant used in semiconductor fabrication, in which a layer of a polymer compound according to the present invention is applied to the porous material with a low dielectric constant.

The layer thickness of the applied polymer compound is preferably 0.5-10 nm, more preferably 1-5 nm, also preferably less than approximately 5 nm, and preferably corresponds to a monolayer of the corresponding polymer used.

In the 150 nm technology generation which is currently in use, the metal track width is 150 nm, the ILD width is 150 nm, the metal track height is approx. 180-300 nm. The layer thickness of the polymer according to the invention is if possible 5 nm or below. For future technology generations, the metal/ILD widths and heights will become narrower. The 45 nm technology generation requires metal track/ILD widths of 45 nm. If an interlayer (liner, barrier layer) (e.g. 10 nm of TAN) is applied as well as a monolayer of polymer, there is no longer much space for a copper track. One advantage of the present invention is that the polymer compounds according to the invention can be applied in very low layer thicknesses.

A further advantage is that on account of the coating according to the invention it is even possible to do away with further lining of the inner walls prior to filling with copper.

The polymer compound can be applied as such or dissolved in a suitable solvent to the region to be treated, by means of spin-on methods or by dip coating.

The application is followed, in a preferred embodiment, by a heating step to dry the applied layer and/or to remove solvents and/or volatile constituents, in particular if the compound is applied together with a solvent.

In one preferred embodiment, an etching step is carried out after the application of the polymer compound and if appropriate the heating step, in order to remove excess polymer compound from the recess. In a particularly preferred embodiment, this can be directly followed by filling with copper. This offers the option of significantly reducing the dimensions of the recess compared to conventional methods, in which the inner walls are first lined with a barrier layer, and this allows further miniaturization.

Alternatively, in an embodiment which is likewise preferred, it is possible to line the inner wall using conventional methods, but with the layer thickness of the barrier layer in this case preferably being significantly less than has hitherto been customary. This can be achieved by prior coating with the polymers according to the invention and is likewise of benefit to miniaturization.

After the barrier layer, for example a tantalum/tantalum nitride layer, has been applied, it is preferably then possible to carry out a targeted etching step in order to remove the barrier layer and excess polymer compound from the base of the recess. This can in turn be followed by filling with copper.

Conventional barrier layer materials which can be used in accordance with the invention include metals, in particular titanium and/or tantalum, metal carbides, in particular tungsten carbide and/or silicon carbide, metal nitrides, in particular tungsten nitride, titanium nitride and/or tantalum nitride, and/or metal carbonitrides, in particular tungsten carbonitride.

The method according to the invention is in particular integrated in semiconductor fabrication, providing a method for integrating porous materials with a low dielectric constant in semiconductor fabrication, comprising the steps of:

a. etching a recess into a layer of a material with a low dielectric constant (ILD) which is located on a substrate, b. applying a polymer compound as defined in the method described above or as defined in claim 17 in order to cover the side walls of the recesses, c. filling the recesses with metal.

After application of the polymer compound by spin-on methods or dip coating, it is preferable to carry out a heat treatment step in order to secure the applied polymer compound and/or to evaporate the solvent and any volatile constituents.

The substrate is preferably a metallization layer of a wafer, more preferably a copper metallization level. According to the invention, the recess is likewise filled with copper.

After the polymer compounds according to the invention have been applied, in a preferred embodiment of the invention an etching step can be carried out in order to remove the polymer layer again, with the exception of the pores in the side walls of the recess that have been filled with the polymer compound. This etching step can be carried out using standard processes, e.g. by means of dry etching in oxygen plasma. It is then optionally possible to line the inner walls with a barrier layer, e.g. with tantalum/tantalum nitride, using standard processes; this layer should preferably be as thin as possible. By way of example, first of all a 15 nm thick TaN layer and then a 10 nm Ta layer can be applied using conventional processes. On account of the fact that the surface-layer pores are filled with the polymer compounds according to the invention, the tantalum/tantalum nitride coating can also be made significantly thinner, which is particularly advantageous in the context of the miniaturization of semiconductor structures. The recess can then be filled with metal, preferably copper, in order to produce the contact to the metal track below, preferably a copper metallization level. This process is also diagrammatically depicted in FIG. 4.

In a particularly preferred embodiment of the invention, it is also possible for filling with metal, in particular copper, to be carried out directly after etching in accordance with step b., without prior deposition of a tantalum/tantalum nitride or other barrier layer. This makes it possible to further reduce the sizes of the etched recesses.

In a further embodiment of the invention, it is possible for a barrier layer, corresponding, for example, to the tantalum/tantalum nitride layer described above, to be deposited after application of the polymer compound. A targeted etch can then be carried out, so that the base of the recess is etched clear, so that it is possible to produce a contact to the copper of a metallization level below. In this method, during the etch substantially only the upper barrier layer and the barrier layer located at the base are etched away together with the polymer compound layer located at the base. This embodiment is diagrammatically depicted in FIG. 5.

The present invention also encompasses a method for connecting metallization levels during semiconductor fabrication, in which:

a. a layer of a material with a low dielectric constant (ILD) is applied to a lower metallization level, b. recesses are etched into the ILD using conventional methods, c. a polymer compound is applied in accordance with the methods of the invention which have already been described or as defined in claim 17 in order to cover the side walls of the recesses and to seal surface-exposed pores, d. the recesses are filled with a metal in order to produce a connection to the lower metallization level.

With this method, it is particularly preferably possible for the recesses to be filled with copper even without further lining of the inner walls.

However, the method can also be carried out, as described above, with a barrier layer lining, in which case the possible options for the procedure which have likewise been described above and are illustrated in FIGS. 4 and 5 are provided and preferred in accordance with the invention.

In the methods according to the invention, it is particularly preferable if group B is one of the following groups:

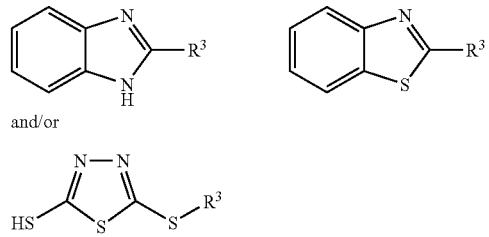

and/or in which $R^1$ and $R^3$ are as defined above. These radicals have achieved particularly good results with regard to the sealing properties and with regard to the functional ability of the wafers treated in this way.

In a less preferred embodiment, group B is a compound of the formula (benzotriazole):

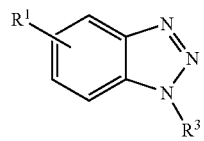

in which $R^1$ and $R^3$ are as defined above.

The invention is explained in more detail below with reference to further figures.

Figure 1:
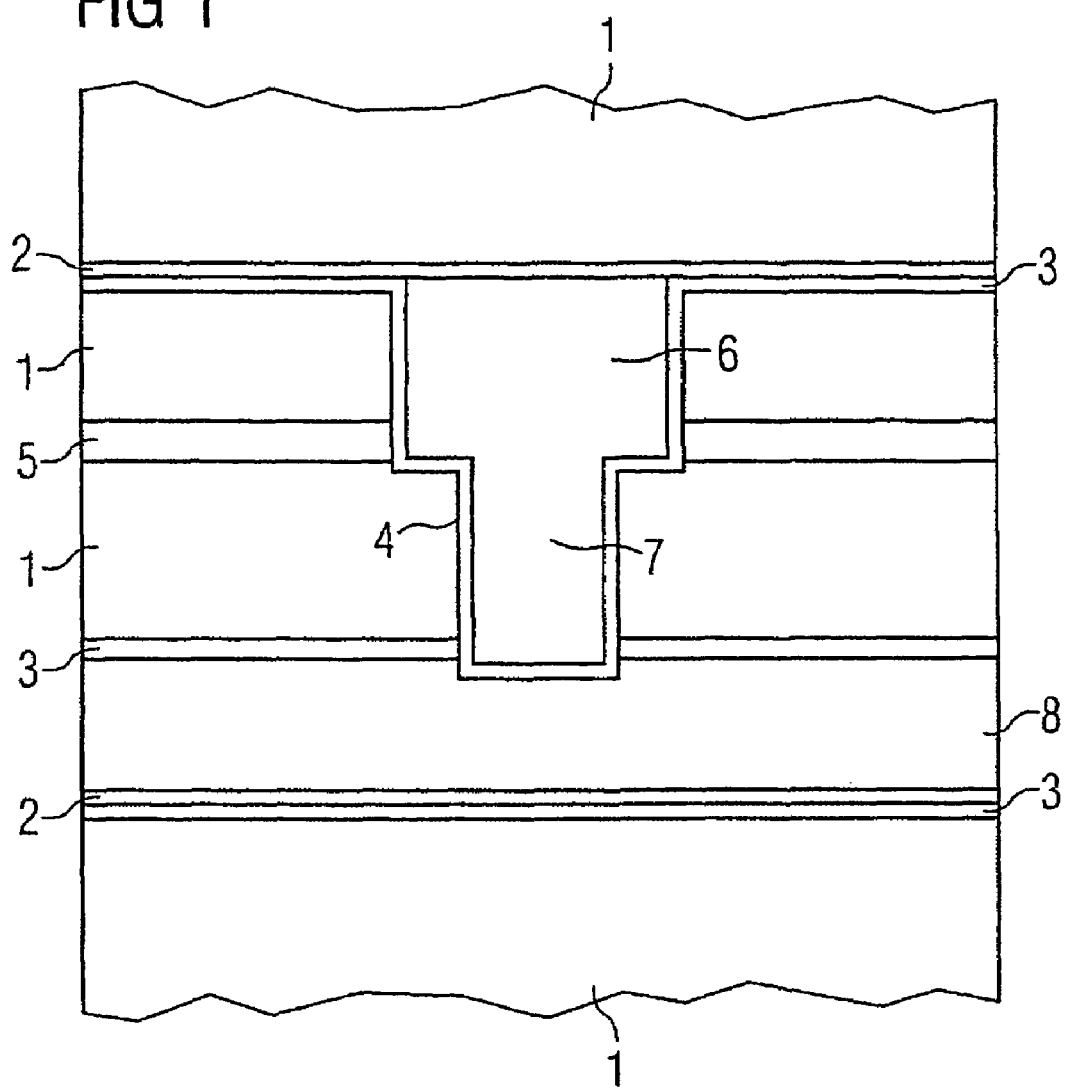
FIG. 1 shows, by way of example, a cross section through a top side of a wafer. This represents a diagrammatic illustration of a "dual Damascene" (DD) stack with two metallization levels and one metallic connection between the two levels illustrated.

FIG. 1 shows, by way of example, a cross section through a wafer top side. This is a diagrammatic illustration of a "dual Damscene" (DD) stack with two metallization levels illustrated.

In the figure, IMD (1) in each case denotes intermetallic dielectric, which corresponds to a low-k material or ILD. Between different IMD layers and copper there are usually etching stop layers and/or protective layers (e.g. nitride (2) and/or SiC (3)). The via (7) is filled with copper, and the walls of the via are coated with a barrier layer (4), e.g. Ta/TaN. Furthermore, an embedded hard mask (5) is present on the IMD layer, which surrounds the via (7). The copper-filled via (7) connects the lower metal conductor (8) to the upper metal conductor (6).

Figure 2:
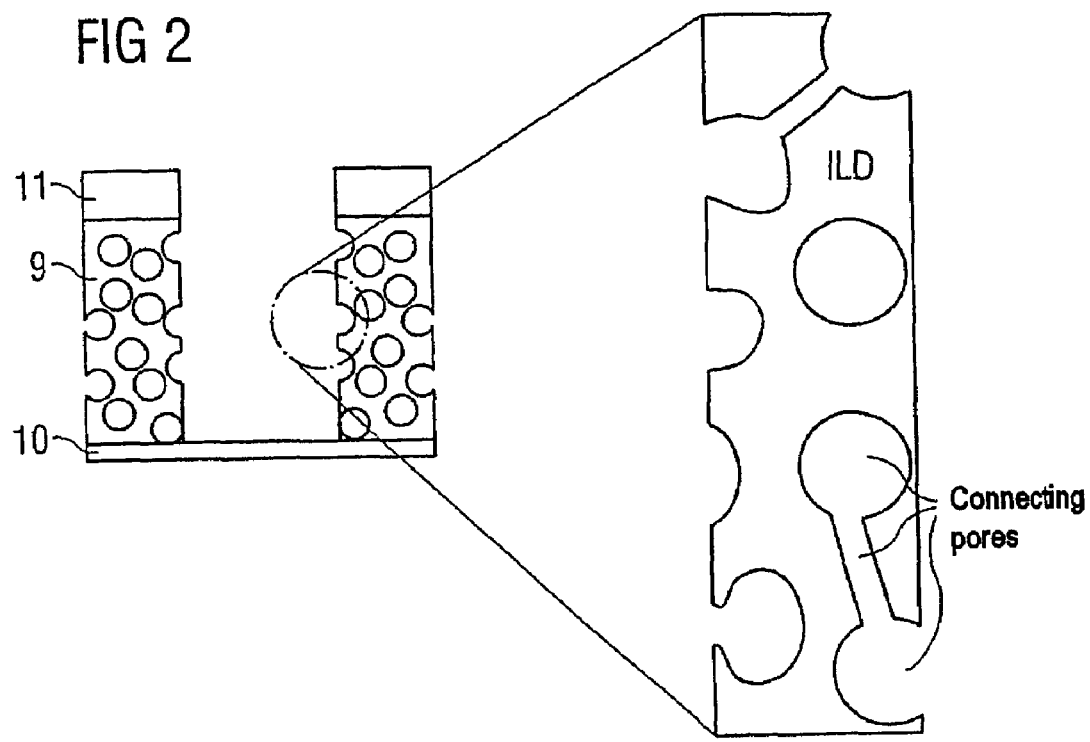
FIG. 2 shows a cross section through a recess which has been etched into a dielectric layer on a substrate in which there are cavities or pores.

FIG. 2 diagrammatically depicts the porosity of the IMD or ILD layers (9). In this case, the ILD (9) is located on a lower layer (10) of, for example, SiC, beneath which the next copper metallization is situated (not shown). Furthermore, the ILD layer is covered on the top side by an auxiliary and/or protective layer (11) of, for example, SiC. The figure also shows an enlarged excerpt including cavities and cavities that are linked to one another by passages. The protective layer (11) situated at the top is typically SiC and in this case functions, as is customary, as a protective layer and also as a stop layer for the chemical mechanical polishing (CMP). The figure shows that contaminating substances can penetrate more deeply into the ILD layer through the passages connecting the pores and may thereby have an adverse effect on the dielectric properties of the ILD layer.

FIG. 3 shows how the inner walls of recesses in ILD are customarily lined or protected by means of barrier layers (12). On account of the porosity, on the one hand it is not possible to cover the entire inner wall, so that interior spaces are still accessible to contaminating substances (FIG. 3a). If a greater quantity of barrier material is deposited, this material can penetrate into existing cavities and in this way have an adverse effect on the dielectric properties of the low-k material. Moreover, at regions of the interior space which are close to the surface, the barrier layer is thinned, which can increase the level of defects during subsequent copper filling.

FIG. 6 diagrammatically depicts the arrangement of the polymer compounds according to the invention within the polymer layer according to the invention when the recess is subsequently filled with copper (20) or a barrier layer (20). Group A forms a bond with the silicon-containing material of the low-k layer and the material of the protective layer, e.g. silicon nitride, silicon carbide, above it. Moreover, groups B which are present in the polymer can bond to copper atoms of the filling. The functional groups B are, moreover, able to prevent oxidation of copper. This in turn prevents the formation of copper ions which could cause electromigration of copper into the ILD material. It is preferable for the orientation of the terminal functional groups B and A in the polymer compounds to be such that a stable boundary layer is formed.

The methods according to the invention can be used in semiconductor fabrication wherever ILD materials with etched recesses are to be found. Therefore, the method according to the invention can be used in the fabrication of semiconductor devices, such as MOSFETs, memory devices, logic devices and throughout the BEOL area.

EXAMPLES

The suitability of the polymer compound materials according to the invention can be demonstrated in the following way:

1. In the first phase of the tests, a blank wafer is used and is coated over the entire surface with the material to be sealed. The polymer compound comprising groups A and B is applied to the material that is to be sealed, and then the sealing of the layer is checked by means of the following methods:
a. layer thickness measurement (determination of the layer thickness)
b. ellipsometric porosity (EP) measurements: the pore size of the material below can be measured by means of the uptake of, for example, toluene. If a pore size cannot be measured, the layer is completely dense.

2. In the second phase, the method can be tested on patterned wafers. For this purpose, the wafers which have been coated with the ILD, after patterning, are coated with the polymer solution and their leaktightness is tested in subsequent tests (cf. above). This can be carried out as described above by means of EP and/or can be tested by electrical evaluation of the fully processed wafer.

Electrical leaktightness measurements may, for example, involve the determination of the dielectric constant or of the breakdown voltage between two metal tracks. In both methods, a change in the parameter is assessed.

Example 1

Patterned wafers, i.e. wafers with uncovered walls of a low-k dielectric (carbon-doped silicon) were immersed for 1 h in a 10% by weight solution of the polymer according to the invention in cyclohexane. Alternatively, the solution can also be applied by spin-on methods. Group A used to produce the polymer was in each case methylene dimethylmethoxysilane, i.e. group A was introduced into the polymer chain, by way of example, via the compound (chloromethyl)dimethylmethoxysilane, with the result that group A was linked to the main polymer chain by a methylene group. The following radicals were respectively used as group B, with $R^3$ for linking to the polymer main chain in each case being a methylene group.

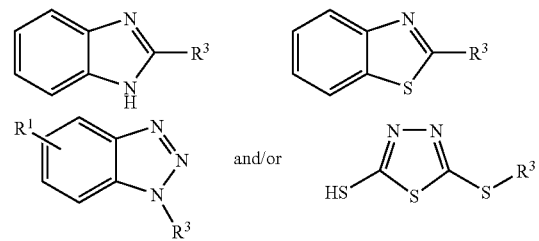

If group B was a benzotriazole radical, $R^1$ was a methyl group at the ortho position with respect to the carbon atom which is linked to the N—$R^3$ group. The polymer main chain used was polypropylene.

Groups A and B were present in approximately equal ratios in the polymer. The molecular weight of the compounds was in each case approximately 40 000 Da.

After coating, the wafer specimens were dried in a furnace at approximately 250° C. under an inert gas atmosphere for 1 h in order to remove residual solvent. The applied layer had a layer thickness of approximately 3 nm (polymer monolayer).

The base of recesses which are present in the wafer is selectively etched by means of a targeted short $N_2/H_2$ etching plasma step, and the surface is etched clear of polymer. The polymer was retained on the side walls and in the pores.

Then, a metallic barrier (tantalum) was applied by means of PVD.

An electrical evaluation of the fully processed wafers in each case resulted in excellent properties for the wafers produced in this way, i.e. there was no evidence of any deterioration in the interlayer dielectric properties. Only in the case of the compounds with a benzotriazole radical as group B were occasional defects determined.

Example 2

The above method was repeated up to and including the removal of the solvent in the furnace.

Then, a non-metallic thin SiC layer (a so-called liner layer with a thickness of 5 nm) was applied to the polymer monolayer deposited in this way by means of ALCVD or PVD.

The base of the recesses was etched clear by means of a short, targeted etching step ($CF_4/H_2$ etching plasma). The polymer layer and the liner layer were retained at the side walls.

Then, a thin Ta layer with a thickness of 5 nm was applied by means of a PVD process as a metallic barrier layer.

As in Example 1, electrical evaluation of the fully processed wafers in each case resulted in excellent properties of the wafers produced in this way, i.e. it was not possible to determine any deterioration in the interlayer dielectric properties. Only in the case of the compounds with a benzotriazole radical as group B were occasional defects recorded once again.

Corresponding results were also obtained if the radicals $R^3$ in group B were varied, e.g. with $R^3$=ethyl.

Example 3

Furthermore, to determine the porosities, the abovementioned compounds were applied to an Si wafer coated with a porous low-k material so as to coat the wafer with the polymer compounds over the entire surface. Ellipsometric porosity measurements using toluene in each case showed that the applied layers had no porosity. Only in the case of the benzotriazole derivates was a slight porosity determined from time to time.

LIST OF REFERENCE NUMERALS

1 Interlayer dielectric (ILD), intermetallic dielectric (IMD) or low-k material
2 Protective layer, nitride
3 Protective layer, SiC
4 Barrier layer, e.g. Ta/TaN
5 Embedded hard mark
6 Upper metal conductor
7 Recess/via
8 Lower metal conductor
9 ILD
10 Lower layer
11 Protective layer, e.g. SiC
12 Barrier layer
13 Copper
14 Etching stop layer
15 ILD
16 Etching stop layer, e.g. SiC
17 $SiO_2$
18 Polymer compound according to the invention
19 Barrier layer, e.g. Ta/TaN
20 Metal layer, e.g. copper or barrier layer, e.g. Ta/TaN

What is claimed is:

1. A polymer compound having a polymer main chain and functional groups A and B, in which the functional group A can be bonded to silicon-containing materials and/or metal nitrides and has the following structure:

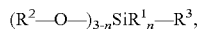

wherein n=1 or 2,
$R^1$ and $R^2$ are in each case an alkyl or aryl group, it being possible for $R^1$ and $R^2$ to be identical or different, and $R^3$ is an alkylene or arylene group;
and the functional group B can be bonded to copper metal and/or tantalum, metal oxides, copper(I) oxide and/or copper(II) oxide and has one or more of the following structures:

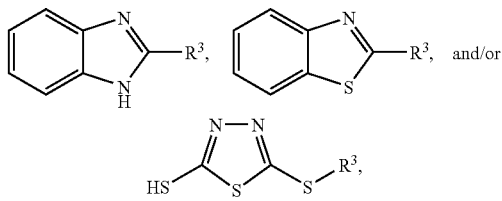

wherein $R^1$ and $R^3$ are as defined in group A,
and groups A and B are each linked to the polymer main chain via $R^3$.

2. The polymer compound as claimed in claim 1, wherein monomers of the polymer main chain are selected from the group consisting of ethylene, propylene, styrene, a (meth)acrylate, an acid, an alcohol, an amine, an amino acid, an ether, and an epoxide.

3. The polymer compound as claimed in claim 1, wherein monomers of the polymer main chain are propylene.

4. The polymer compound as claimed in claim 1, wherein $R^1$ and/or $R^2$ in group A are straight-chain or branched $C_1$-$C_6$ alkyls, preferably methyl or ethyl.

5. The polymer compound as claimed in claim 1, wherein $R^1$ and/or $R^2$ in group A is a substituted or unsubstituted phenyl, biphenyl and/or naphthyl.

6. The polymer compound as claimed in claim 5, wherein the substituent is a $C_1$-$C_{18}$ alkyl radical, preferably a $C_1$-$C_6$ alkyl radical.

7. The polymer compound as claimed in claim 1, wherein $R^1$ and/or $R^2$ in group A is a phenyl radical.

8. The polymer compound as claimed in claim 1, wherein $R^3$ in group A is a $C_1$-$C_{18}$ alkylene radical, preferably a $C_1$-$C_6$ alkylene radical, and/or a $C_4$-$C_8$ cycloalkylene radical, preferably a $C_5$-$C_6$ cycloalkylene radical.

9. The polymer compound as claimed in claim 1, wherein $R^3$ in group B is a $C_1$-$C_{18}$ alkylene radical, preferably a $C_1$-$C_6$ alkylene radical, and/or a $C_4$-$C_8$ cycloalkylene radical, preferably a $C_5$-$C_6$ cycloalkylene radical.

10. The polymer compound as claimed in claim 1, wherein $R^3$ in group A and/or B, independently of one another, is a substituted or unsubstituted phenylene, biphenylene and/or naphthylene, and if it is substituted the substituent is preferably a $C_1$-$C_{18}$ alkyl radical, more preferably a $C_1$-$C_6$ alkyl radical.

11. The polymer compound as claimed in claim 1, wherein $R_3$ in group A and/or B, independently of one another, is a phenylene radical.

12. The polymer compound as claimed in claim 1, wherein $R^1$ in group B is a straight-chain or branched $C_1$-$C_6$ alkyl radical, preferably methyl or ethyl.

13. The polymer compound as claimed in claim 1, wherein the polymers have a molecular weight of from 10 000 Da to 10 000 000 Da, preferably 20 000-1 000 000 Da.

14. The polymer compound as claimed in claim 1, wherein the polymer compound is substantially linear.

15. A composition containing one or more polymer compounds as claimed in claim 1 and one or more solvents.

16. The composition as claimed in claim 15, wherein the solvents used are alkanes, preferably $C_5$-$C_{10}$ isoalkanes, such as hexane and/or heptane, cycloalkanes, preferably cyclopentane and/or cyclohexane, ethers, preferably $C_2$-$C_8$ dialkyl ethers and/or tetrahydrofuran, and/or ketones, in particular $C_1$-$C_8$ dialkyl ketones, preferably methyl ethyl ketone.

17. The polymer compound as claimed in claim 2, wherein the acid is selected from the group consisting of adipic acid and (iso)terephthalic acid.

18. The polymer compound as claimed in claim 2, wherein the alcohol is selected from the group consisting of butanediol, ethanediol, and ethylene glycol.

19. The polymer compound as claimed in claim 2, wherein the amine is selected from the group consisting of ethanediamine and hexanediamine.

20. The polymer compound as claimed in claim 2, wherein the amino acid is selected from the group consisting of aminocaprylic acid and ε-caprolactam.

21. The polymer compound as claimed in claim 2, wherein the ether is selected from the group consisting of propylene oxide and ethylene oxide.

22. The polymer compound as claimed in claim 2, wherein the epoxide is epichlorohydrin.

23. The polymer compound as claimed in claim 1, wherein the polymer main chain comprises a silicone.

24. The polymer compound as claimed in claim 23, wherein the silicone is prepared by condensing monomers selected from the group consisting of dimethyldichlorosilane and diphenyldichlorosilane.

* * * * *